(12) United States Patent
Pan et al.

(10) Patent No.: US 12,074,164 B2
(45) Date of Patent: Aug. 27, 2024

(54) FINFET PITCH SCALING

(71) Applicant: Taiwan Semiconductor Manufacturing Co., Ltd., Hsinchu (TW)

(72) Inventors: Kuan-Ting Pan, Taipei (TW); Yi-Ruei Jhan, Keelung (TW); Kuo-Cheng Chiang, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 206 days.

(21) Appl. No.: 17/815,185

(22) Filed: Jul. 26, 2022

(65) Prior Publication Data

US 2022/0367455 A1 Nov. 17, 2022

Related U.S. Application Data

(62) Division of application No. 16/888,457, filed on May 29, 2020, now Pat. No. 11,527,533.

(51) Int. Cl.
| | |
|---|---|
| *H01L 27/088* | (2006.01) |
| *H01L 21/8234* | (2006.01) |
| *H01L 29/66* | (2006.01) |
| *H01L 29/78* | (2006.01) |

(52) U.S. Cl.
CPC .. *H01L 27/0886* (2013.01); *H01L 21/823431* (2013.01); *H01L 21/823468* (2013.01); *H01L 29/66545* (2013.01); *H01L 29/66795* (2013.01); *H01L 29/785* (2013.01)

(58) Field of Classification Search
CPC ..... H01L 21/823481; H01L 21/823878; H01L 21/823468; H01L 21/823431; H01L 29/66553; H01L 29/66795; H01L 29/785; H01L 29/6656; H01L 27/0886
See application file for complete search history.

(56) References Cited

U.S. PATENT DOCUMENTS

| | | | |
|---|---|---|---|
| 9,608,116 B2* | 3/2017 | Ching | H01L 21/283 |
| 2017/0221893 A1* | 8/2017 | Tak | H01L 21/823481 |

* cited by examiner

*Primary Examiner* — Tuan A Hoang
(74) *Attorney, Agent, or Firm* — HAYNES AND BOONE, LLP

(57) ABSTRACT

According to one example, a method includes forming a first set of fin structures on a substrate, forming a sacrificial material between fin structures within the first set of fin structures, forming a dummy gate with a planar bottom surface over the fin structures and the sacrificial material, forming sidewall structures on the dummy gate, laterally etching the sacrificial material underneath the sidewall structures, depositing a lower sidewall structure where the sacrificial material was removed, removing the dummy gate, removing the sacrificial material, and forming a real gate over the fin structures.

20 Claims, 13 Drawing Sheets

FINFET PITCH SCALING

PRIORITY

This is a divisional application of U.S. patent application Ser. No. 16/888,457, filed on May 29, 2020, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
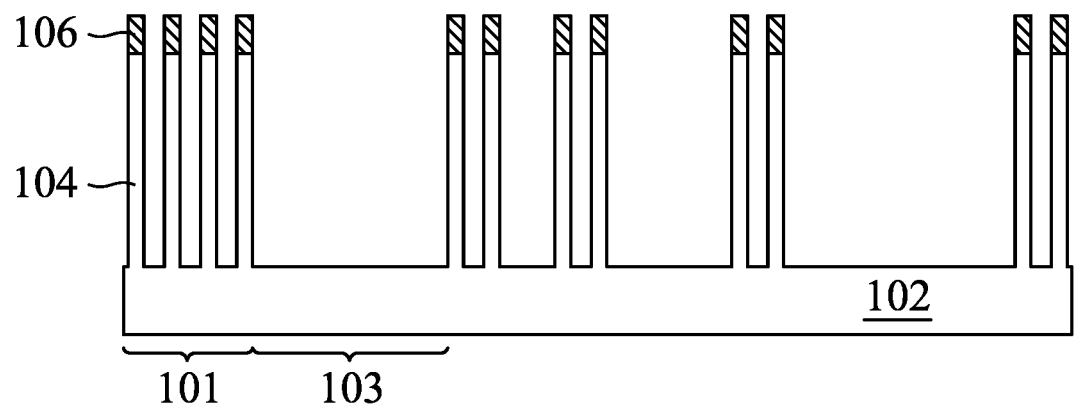
FIGS. 1A, 1B, 1C, 1D, 1E, 1F, 1G, 1H, 1I, 1J, 1K, 1L, 1M, 1N, 1O, 1P, 1Q, 1R, 1S, and 1T are diagrams showing an illustrative process for forming a finFET structure with improved pitch scaling, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), particularly, as fin-like FETs (FinFETs). FinFET devices provide for improved device performance over planar transistors because in a finFET device, the gate surrounds three sides of the channel. Conventional methods for forming a finFET device involve forming a dummy gate over a set of fin structures running in parallel. Sidewall spacers are then formed on the sidewalls of the gate. After the sidewall spacers are formed, source/drain regions may be formed on the fin structures on both sides of the gate. After the source/drain regions are formed, and an interlayer Dielectric Layer (ILD) is formed over the source/drain regions, the dummy gate can be replaced with a real gate that includes a conductive material such as a metal material. However, as technology nodes move to smaller and smaller pitch sizes, it becomes difficult to form the dummy gate properly within the spaces between fin structures. Moreover, heavy etching is often required to remove the polysilicon residue from the spaces between the fin structures. This heavy etching can cause damage to the fin structures and thus limits the size and pitch of fin structures.

According to principles described herein, instead of forming the dummy gate between the fin structures, a sacrificial material is deposited within the space between the fin structures. Then, the dummy gate is formed as a planar structure along the top of the fin structures. After the sidewall structure is formed on that dummy gate structure, the sacrificial material underneath the sidewall structure may be laterally etched and replaced with a dielectric material. Then, at the appropriate time, when the dummy gate is removed, the sacrificial material underneath the dummy gate is removed as well. This exposes the space between the fin structures. Then, the real (e.g., metal) gate structure can then be formed over and between the fin structures.

FIGS. 1A, 1B, 1C, 1D, 1E, 1F, 1G, 1H, 1I, 1J, 1K, 1L, 1M, 1N, 1O, 1P, 1Q, 1R, 1S, and 1T are diagrams showing an illustrative process for forming a finFET structure with improved pitch scaling. FIG. 1A illustrates a set of fin structures 104 formed on a substrate 102. In the present example, there are different clusters 101 of fin structures separated by spaces 103. In general, the pitch of fin structures within a particular cluster 101 is substantially consistent and may be less than 24 nanometers. The space between fin structures may be within a range of about 5-10 nanometers. The height of the fin structures 104 may be greater than 50 nanometers or greater than 60 nanometers. Using the techniques described herein, a larger fin height is achieved in comparison to conventional processes. The larger fin height improves devices performance.

The semiconductor substrate 102 may be a silicon substrate. The semiconductor substrate may be part of a silicon wafer. Other semiconductor materials are contemplated. The substrate 102 may include an elementary (single element) semiconductor, such as silicon, germanium, and/or other suitable materials; a compound semiconductor, such as silicon carbide, gallium arsenide, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

The fin structures 104 may be formed using a patterning process. For example, a hard mask layer 106 and a photoresist layer (not shown) may be deposited onto the substrate 102. The hardmask layer 106 may include at least one of silicon oxide (SiO2), silicon nitride (SiN), silicon carbide (SiC), silicon oxynitride (SiON), silicon oxycarbide (SiOCN), hafnium oxide (HfO2), aluminum oxide (Al2O3), and zirconium oxide (ZrO2). Other materials are contemplated. The photoresist may then be exposed to a light source through a photomask. The photoresist may then be developed such that the portions of the photoresist remain while other portions are removed. The pattern within the developed photomask is then transferred to the hard mask layer 106, which is then transferred to the substrate 102 through an etching process. This forms the fin structures 104 as shown. The fin structures comprise elongated fin-like structures that run parallel to each other. FIG. 1A illustrates a view that is cut perpendicular to the direction in which the fin structures 104 run.

Figure 1B:
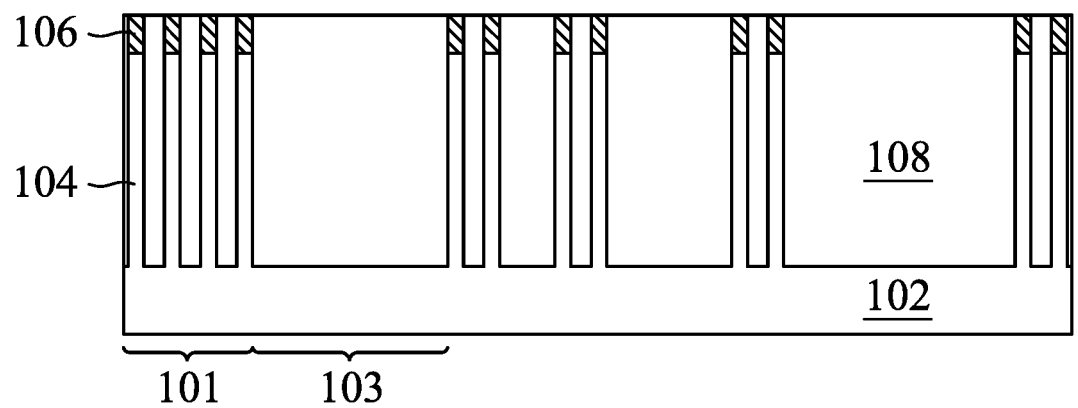

FIG. 1B illustrates a process by which an isolation structure 108 is formed. The isolation structure may be, for example, a shallow trench isolation (STI) structure. The STI layer 108 may be a dielectric material that is used to electrically isolate one device from another. After the STI material is deposited, a Chemical Mechanical Polishing (CMP) process is applied to planarize the top surface of the workpiece such that the hard mask layer 106 is exposed. A CMP process involves applying a slurry to the surface of the workpiece. The slurry includes etching chemicals as well as solid particles. A polishing head is then moved across the surface of the workpiece and the chemical and mechanical forces on the workpiece result in removing material from the workpiece at a substantially similar rate so as to create a planar surface.

Figure 1C:
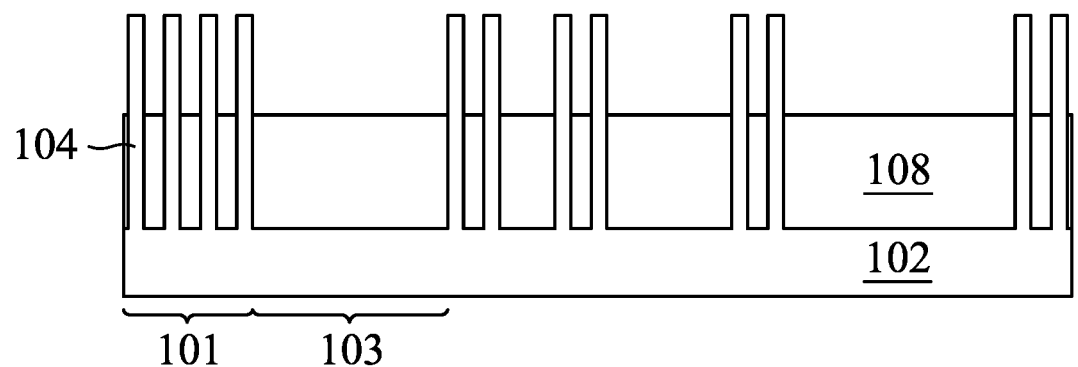

FIG. 1C illustrates a process by which the STI layer 108 is recessed. The STI layer 108 may be recessed to a point approximately halfway between a bottom and a top of the fin structure. However, in some examples, the STI layer 108 may be recessed to different heights along the height of the fin structures 104.

Figure 1D:
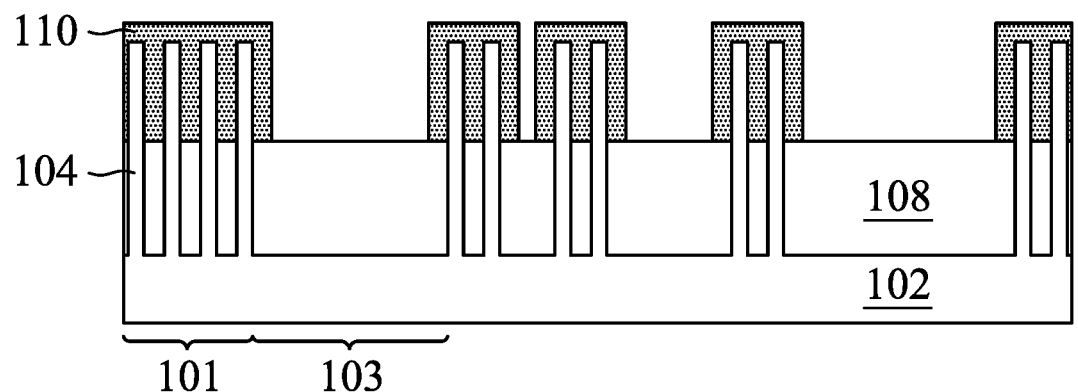

FIG. 1D illustrates the formation of a sacrificial material 110 on and between the fin structures 104. The sacrificial material 110 may be, for example, silicon nitride (SiN) or silicon germanium (SiGe). Such materials are easier to fit within the spaces between fin structures. In some examples, the sacrificial material is selectively deposited over the fin structures 104 so as to leave the spaces 103 between sets of fin structures exposed. In some examples, however, the sacrificial material 110 may be formed over the spaces 103 as well and then removed using a directional etching process such as a dry etching process. Such processes may be similar to spacer etching processes.

Figure 1E:
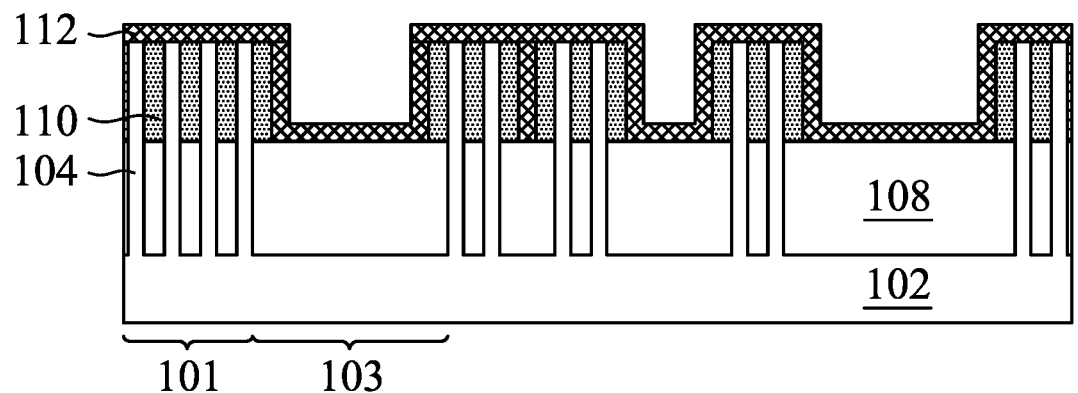

FIG. 1E illustrates the formation of a first dielectric layer 112 over the fin structures 104 and the spaces 103 between sets of fin structures 101. The first dielectric layer 112 may be a low-k dielectric material such as silicon nitride (SiN), silicon oxynitride (SiON), or silicon oxycarbonitride (SiOCN). The first dielectric layer 112 is formed in a conformal manner along sidewalls of the space 103 between sets of fin structures 101 and along the bottom of the STI layer 108.

Figure 1F:
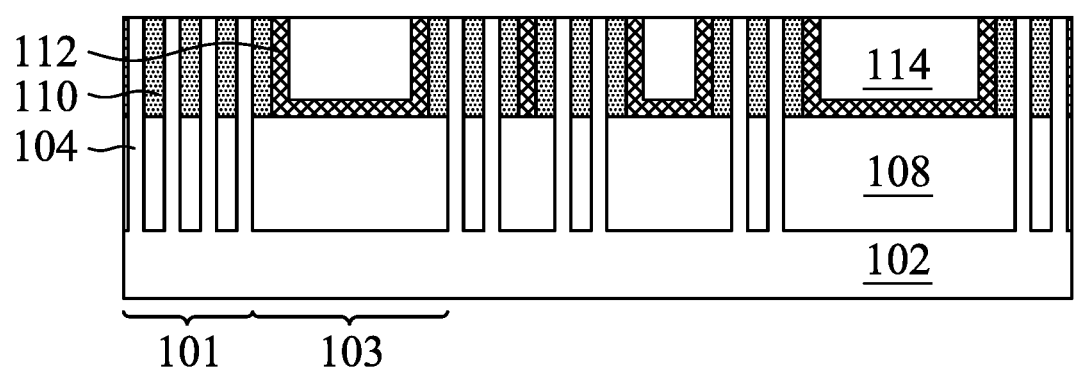

FIG. 1F illustrates the formation of an oxide layer 114 over the first dielectric layer 112 and a CMP process to planarize the top surface of the work-piece. The CMP process also exposes the top surfaces of the fin structures 104 and the sacrificial material 110.

Figure 1G:
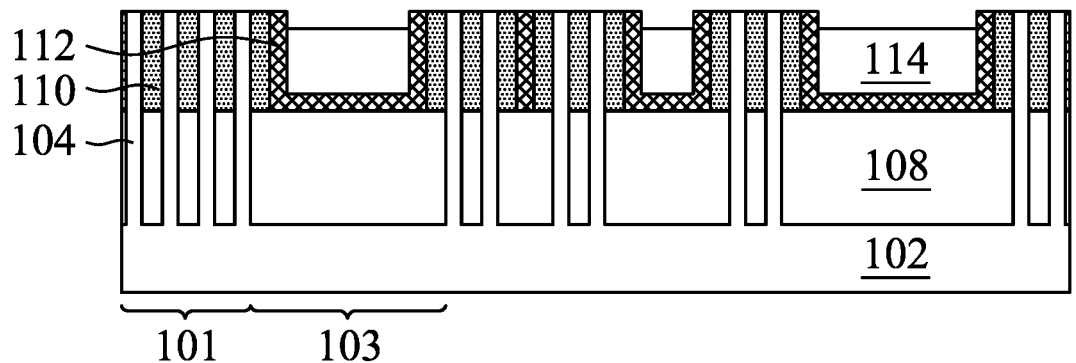

FIG. 1G illustrates a process by which the oxide layer 114 is recessed. This may be done using a selective etching process. The selective etching process may be designed such that when applied, it removes the oxide layer 114 without substantially affecting the other layers, such as the first dielectric layer 112, the fin structures 104 and the sacrificial material 110.

Figure 1H:
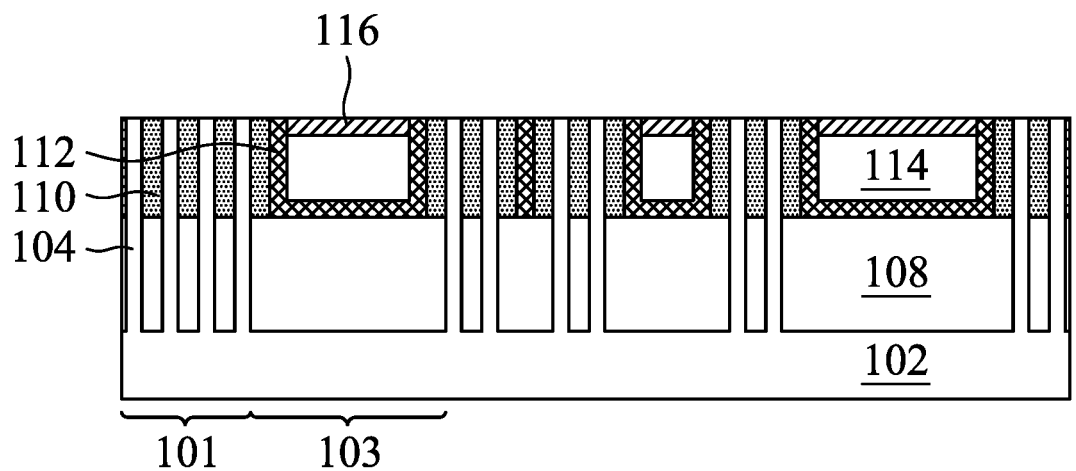

FIG. 1H illustrates the formation of a second dielectric layer 116 on the oxide layer within the space created by the recessing process illustrated in FIG. 1G. The second dielectric layer 116 may also be a low-k dielectric material. The second dielectric layer 116 may be, for example, silicon nitride (SiN), silicon carbonitride (SiCN), silicon oxycarbide (SiOC), silicon oxycarbonitride (SiOCN). In some examples, the second dielectric layer 116 may be a high-k dielectric such as hafnium oxide (HfO2), zirconium oxide (ZrO2), hafnium aluminum oxide (HfAlOx), hafnium silicon oxide (HfSiOx), or aluminum oxide (Al2O3). As will be shown in more detail below, the second dielectric layer 116 isolates the oxide layer 114 from the gate structure. In some examples, after the second dielectric layer 116 is formed, a CMP process is performed to planarize the surface of the workpiece.

Figure 1I:
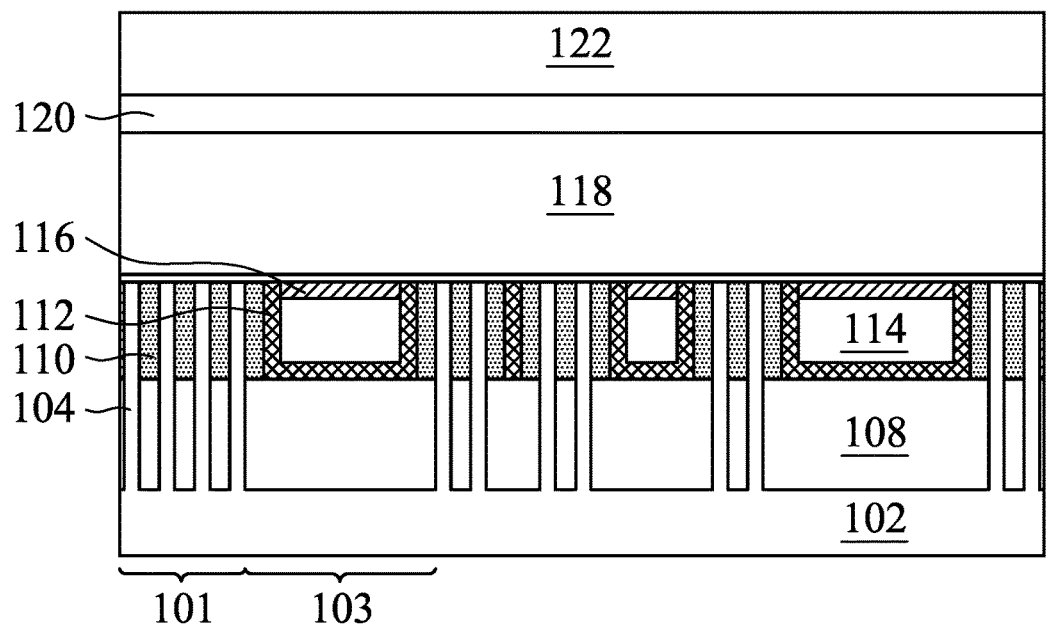

FIG. 1I illustrates the formation of a dummy gate layer 118, along with two hard mask layers 120, 122. The first hard mask layer 120 may be a silicon nitride layer and the second hard mask layer 122 may be an oxide layer. The dummy gate layer 118 is thus formed along a planar surface. In other words, the bottom surface of the dummy gate layer 118 directly contacts a planar line that includes top surfaces of the fin structures 104, the sacrificial material 110, the first dielectric layer 112, and the second dielectric layer 116. The dummy gate layer 118 may be a polysilicon layer. Because the polysilicon dummy gate layer 118 is deposited onto a planar surface, there are fewer issues (such as gaps in the polysilicon) resulting from fitting the polysilicon within the space between fin structures.

Figure 1J:
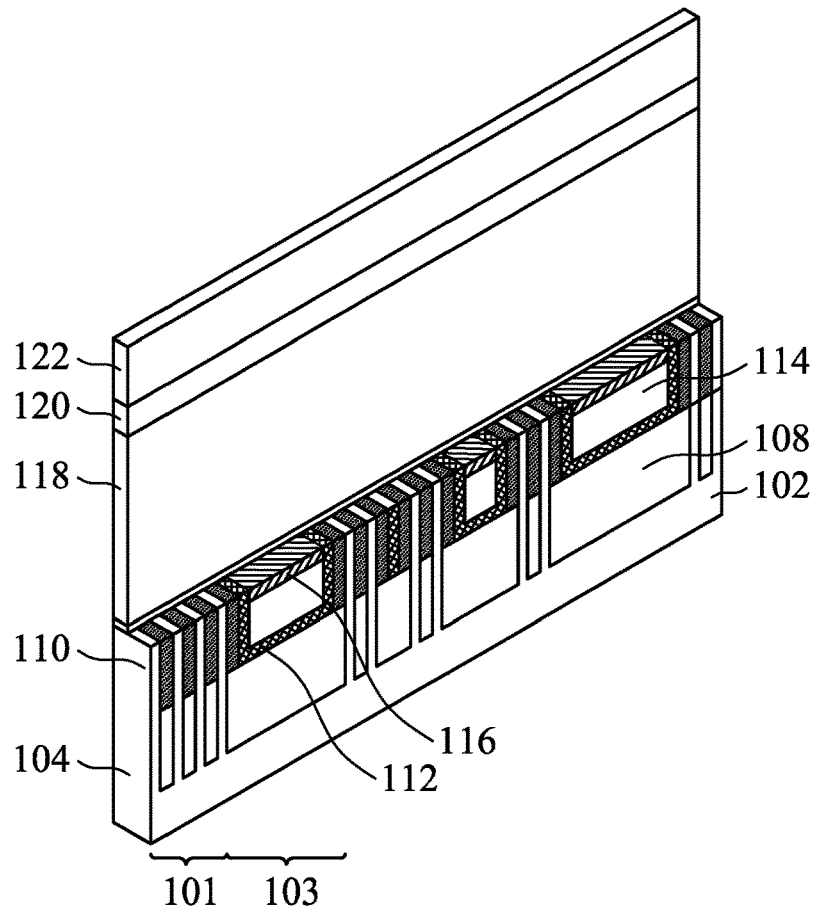

FIG. 1J illustrates the workpiece from a perspective view in which the dummy gate layer 118 and hard mask layers 120, 122 have been patterned into a dummy gate structure. For example, the dummy gate layer 118 and hard mask layers 120, 122 may be deposited in a uniform manner and then patterned using a photolithographic process. The patterning process exposes the fin structures 104, the sacrificial material 110, the first dielectric layer 112, and the second dielectric layer 116 in regions other than where the dummy gate is formed (and ultimately where the real gate where be formed).

Figure 1K:
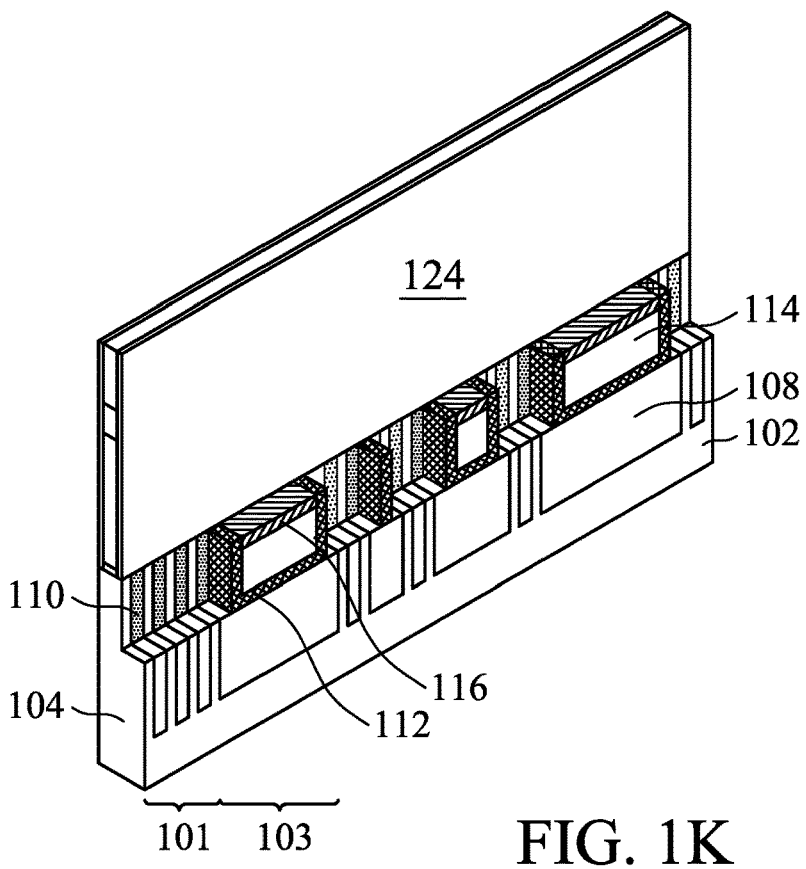

FIG. 1K illustrates the formation of a sidewall spacer 124 on sidewalls of the dummy gate 118. The sidewall spacer 124 may be a dielectric material. After the sidewall spacer 124 is formed, an etching process may be applied to remove portions of the fin structures 104 where source/drain regions are to be formed. This etching process may be done in accordance with photolithographic processes so that the appropriate portions of the workpiece are etched.

Figure 1L:
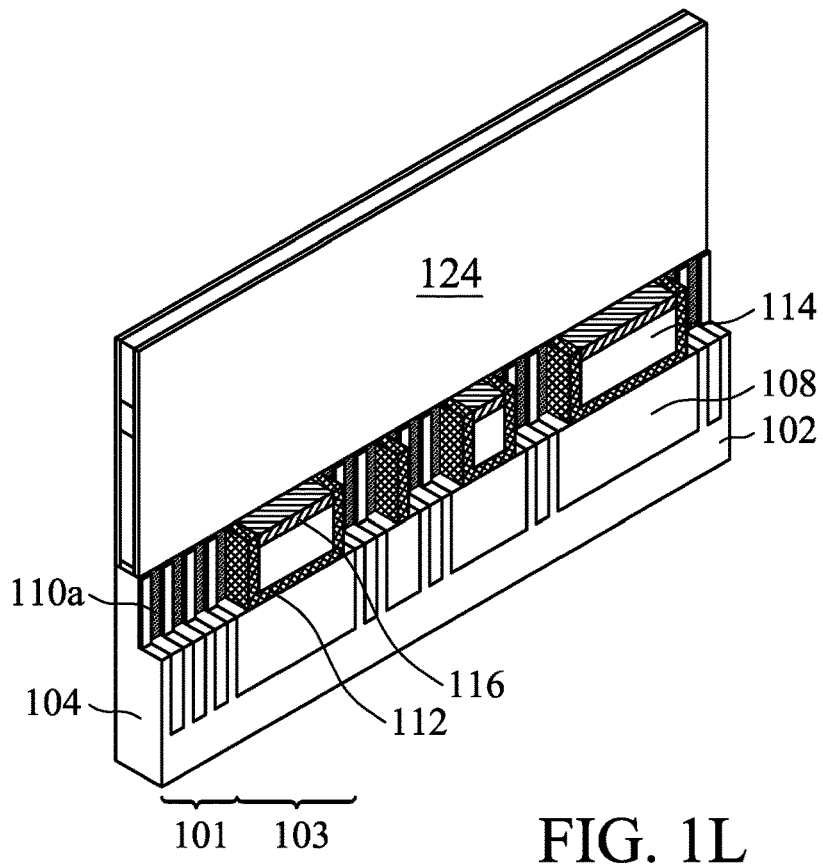

FIG. 1L illustrates a lateral removal process such as a lateral etching process in which a portion of the sacrificial material 110 is removed to leave a void 110a underneath the sidewall spacer 124. The lateral etching process may be a unidirectional etching process such as a wet etching process. The wet etching process may use an acid-based etchant such as: sulfuric acid ($H_2SO_4$), perchloric acid ($HClO_4$), hydroiodic acid (HI), hydrobromic acid (HBr), nitric acid ($HNO_3$), hydrochloric acid (HCl), acetic acid ($CH_3COOH$), citric acid ($C_6H_8O_7$), potassium periodate ($KIO_4$), tartaric acid ($C_4H_6O_6$), benzoic acid ($C_6H_5COOH$), tetrafluoroboric acid ($HBF_4$), carbonic acid ($H_2CO_3$), hydrogen cyanide (HCN), nitrous acid ($HNO_2$), hydrofluoric acid (HF), or phosphoric acid ($H_3PO_4$). In some examples, an alkaline-based etchant may be used. Such etchants may include but are not limited to ammonium hydroxide ($NH_4OH$) and potassium hydroxide (KOH).

In some examples, the void 110a may have a depth that substantially matches the thickness of the sidewall spacer 124. In some examples, the depth of the void 110a may be greater than the thickness of the sidewall spacer 124. In some examples, the depth of the void 110a may be less than the thickness of the sidewall spacer. In some examples, the depth of the void 110a may be within a range of about 4-10 nanometers. In some examples, the depth of the void 110a may be within a range of about 5-15 nanometers.

Figure 1M:
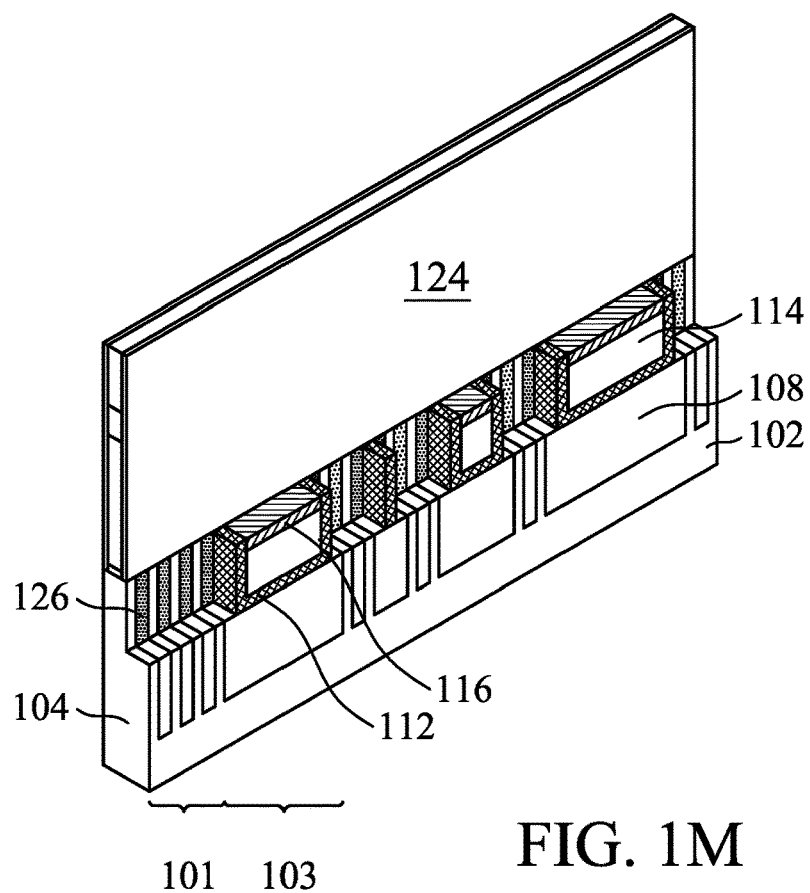

FIG. 1M illustrates the formation of a lower sidewall spacer 126 within the void 110a. The lower sidewall spacer 126 will ultimately be disposed against the gate structure between the fin structures 104. Thus, the top surface of the lower sidewall spacer 126 corresponds to and is thus on a same level as the top surface of the fin structures 104. The lower sidewall spacer 126 may be a low-k dielectric layer such as silicon nitride (SiN), silicon carbonitride (SiCN), silicon oxycarbide (SiOC), silicon oxycarbonitride (SiOCN). In some examples, the lower sidewall spacer 126 may be a different material than the sidewall spacer 124. The thickness of the lower sidewall spacer 126 may be similar to the depth of the void 110a. The thickness of the lower sidewall spacer 126 may be within a range of about 4-10 nanometers.

To form the lower sidewall spacer 126, the spacer material may be deposited onto the workpiece and then etched back. Specifically, a selective etching process may be designed such that it removes the lower sidewall spacer material directionally and does not substantially affect the other exposed portions of the workpiece. The portions of the lower sidewall structure 126 underneath the sidewall spacer 124 will thus be protected from the directional etching process.

Figure 1N:
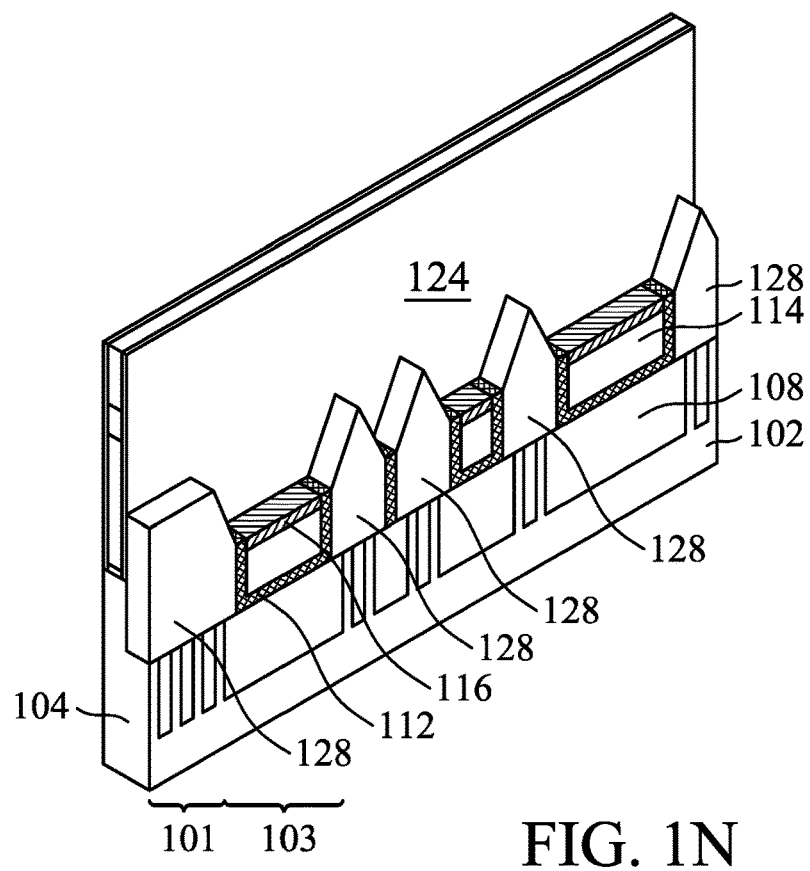

FIG. 1N illustrates the formation of source/drain regions 128 within the spaces created by the etching process shown in FIG. 1L. The source/drain regions 128 may be formed using an epitaxial growth process to form doped regions that will serve as the active regions of transistor devices.

Figure 1O:
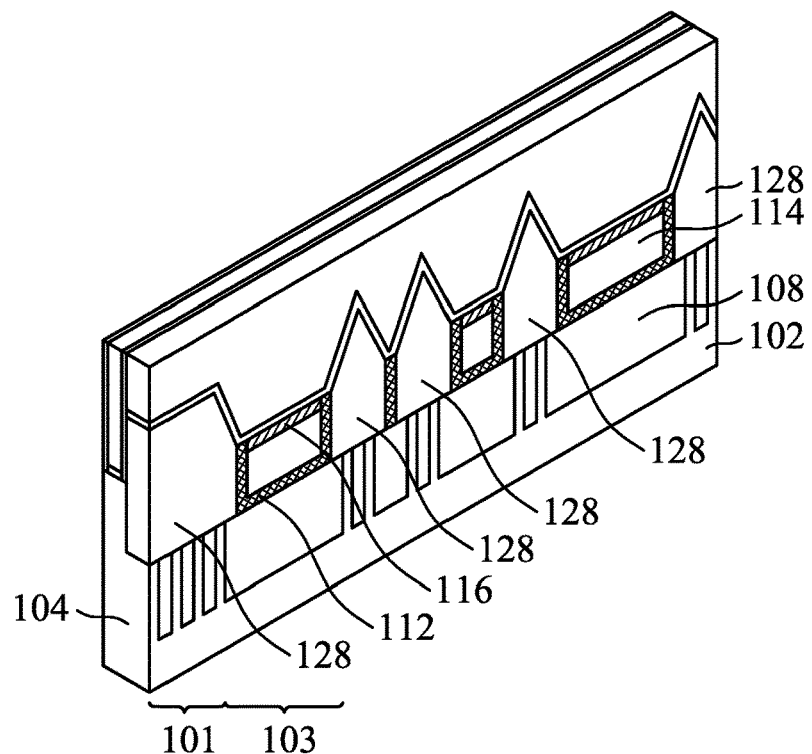
Figure 1P:
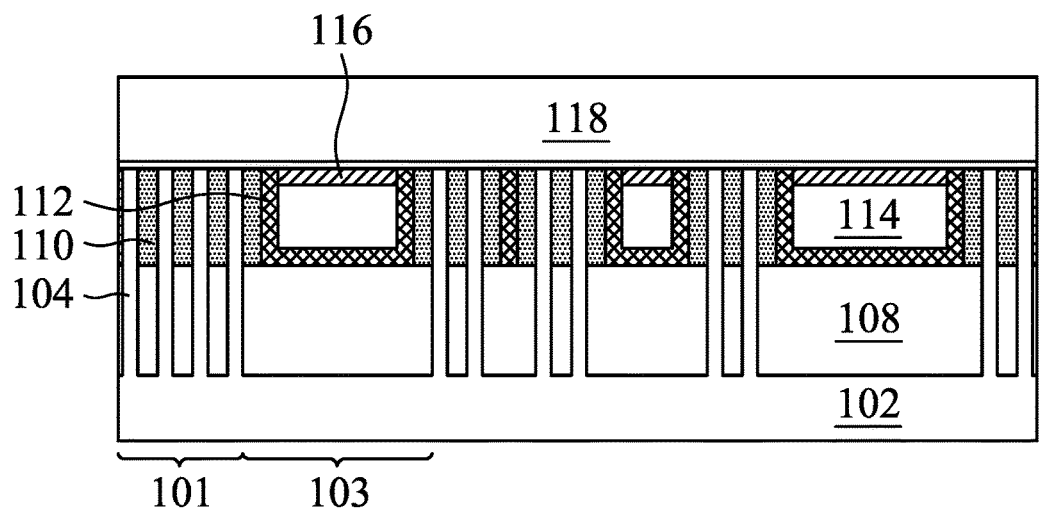

FIG. 1O illustrates a process for forming an ILD layer 130 on the workpiece. The ILD layer is a dielectric material that isolates different components of an integrated circuit from each other. After the ILD layer 130 is deposited, a CMP process is performed to planarize the top surface of the workpiece. The CMP process may be applied so as to remove the hard mask layers 120, 122 and expose the top surface of the dummy gate layer 118. FIG. 1P illustrates the workpiece after the CMP process and along the dummy gate layer.

Figure 1Q:
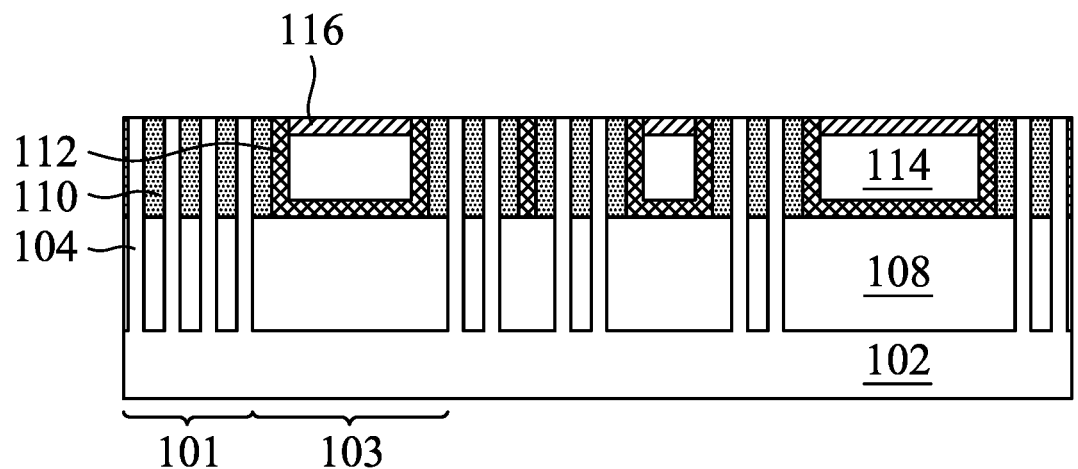

FIG. 1Q illustrates a removal process in which the dummy gate material is removed. Although not shown in this view, the sidewall spacer 124 remains in place while the dummy gate structure 118 is removed. The dummy gate structure may be removed using an etching process. The etching process may be a unidirectional process such as a wet etching process that removes the dummy gate material 118 without substantially affecting the other materials.

Figure 1R:
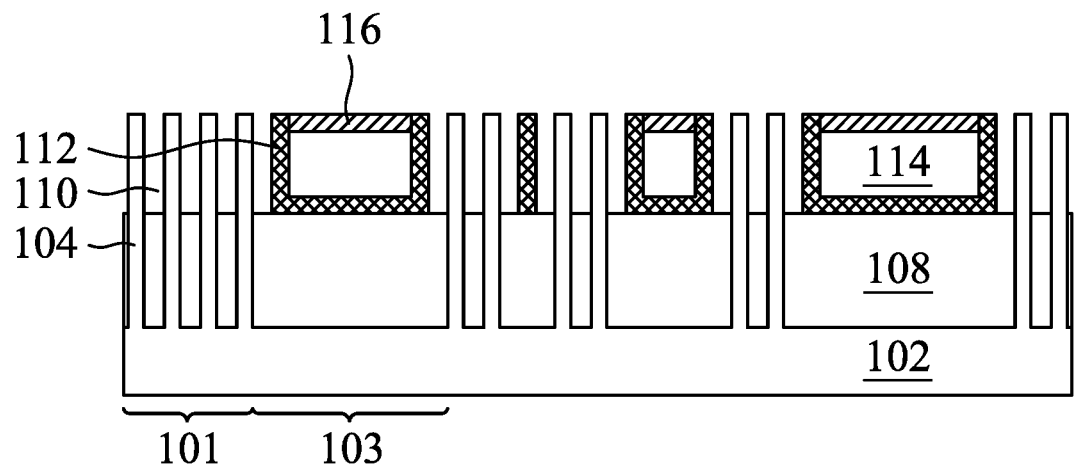

FIG. 1R illustrates a removal process in which the sacrificial material is removed. The sacrificial material 110 may also be removed using a unidirectional etching process such as a wet etching process. The wet etching process may be selective so as to remove the sacrificial material 110 while leaving the fin structures 104, first dielectric material 112, and second dielectric material 116 substantially intact. By removing the sacrificial material 110, the space between the fin structures 104 is exposed and thus allows for deposition of the metal gate.

Figure 1S:
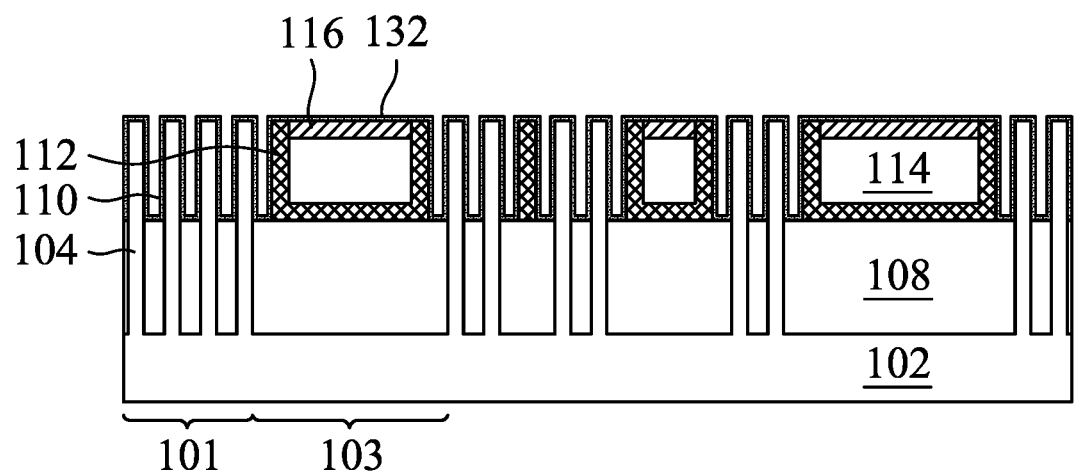

FIG. 1S illustrates deposition of a high-k dielectric layer 132 over the fin structures. In some examples, an interfacial layer (not shown) may be deposited on the fin structures 104 before the high-k dielectric layer is deposited. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

Figure 1T:
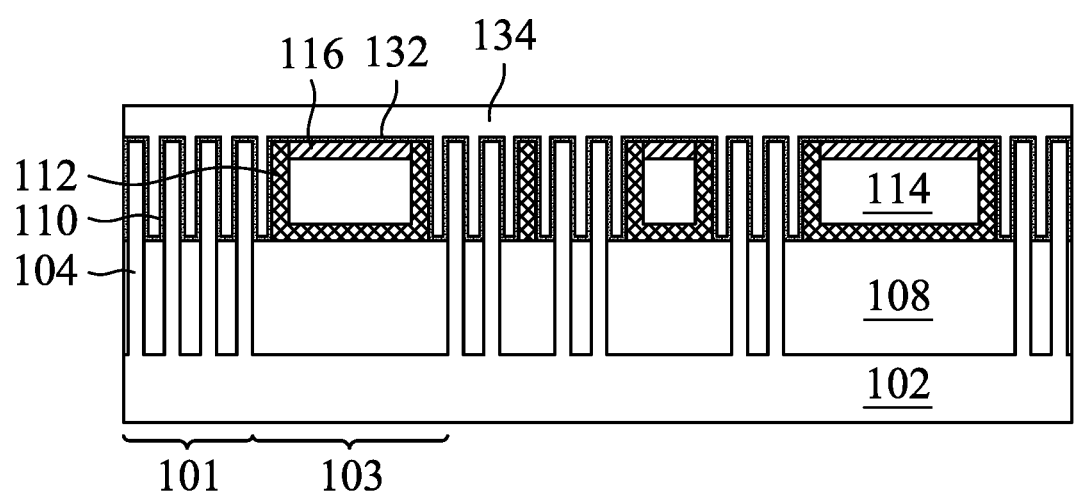

FIG. 1T illustrates deposition of a real gate 134 that replaces the dummy gate. The real gate 134 may include a conductive material such as a metal material. The metal material is deposited to surround the sides of the fin structures 104 and thus form a finFET device. In some examples, the real gate 134 may include a workfunction layer (not shown). The workfunction layer may be a workfunction metal. Such metal is designed to metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (WSN), tungsten (W), cobalt (Co), molybdenum (Mo), etc. Various examples of n-type workfunction metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC). Using the techniques described herein, higher fin structures 104 are achievable as well as reduced scaling.

Figure 2:
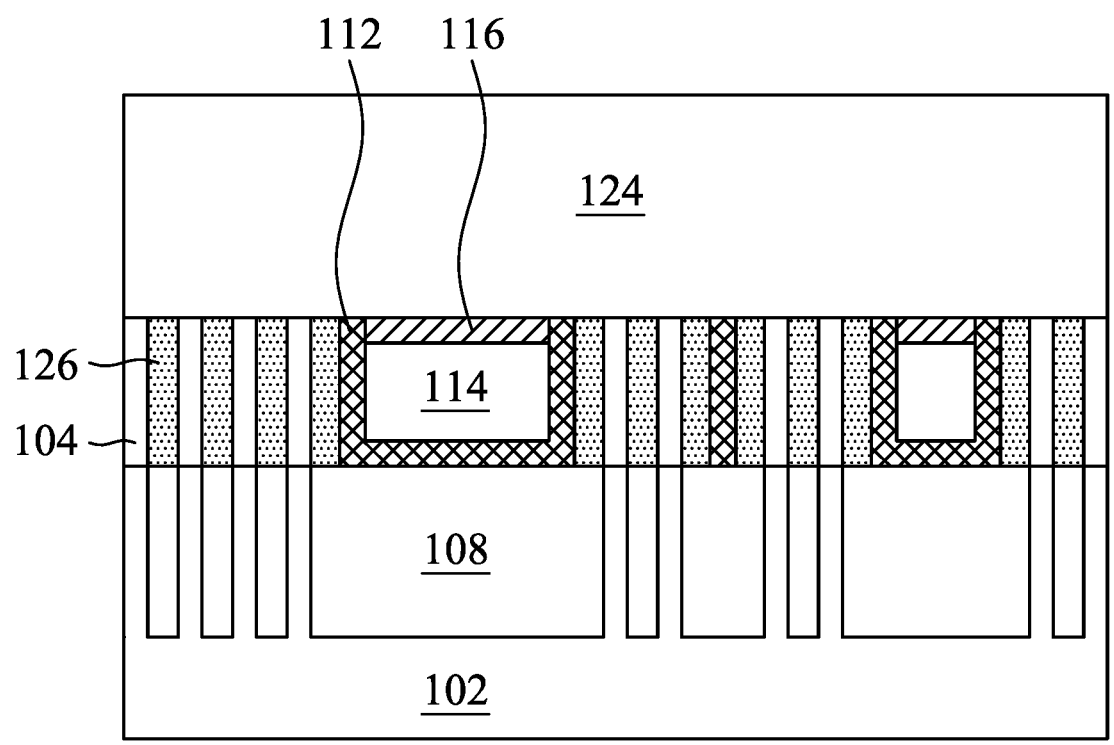
FIG. 2 is a diagram showing a finFET device along a gate spacer, according to one example of principles described herein.

FIG. 2 is a diagram showing a finFET device along a gate spacer. Using principles described herein, the sidewall spacer of the gate has two components. Specifically, the sidewall spacer includes the upper portion spacer 124 that is on the upper portion of the gate and a lower portion spacer 126 that is on the lower portion of the gate. The top of the lower spacer 126 corresponds with the top surface of the fin structures 104. In other words, the top surface of the fin structures 104 are coplanar with the top surface of the lower portion spacer 126. Thus, the bottom surface of the upper portion spacer 124 is also coplanar with the top surface of the fin structures 104. Furthermore, in the spaces between clusters of fins, the bottom of the upper spacer 124 directly contacts the dielectric layer 116 as well as portions of the dielectric layer 112. The first dielectric layer 112, the oxide layer 114, and the second dielectric layer 116 form a dielectric stack.

Figure 3:
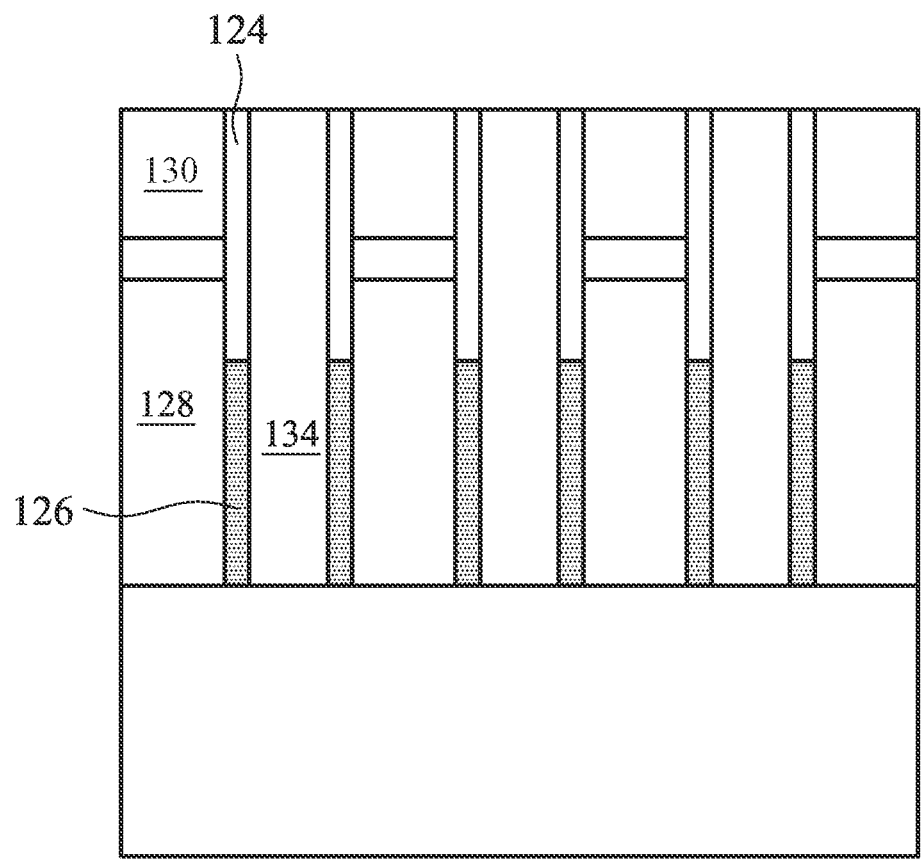
FIG. 3 is a diagram showing an illustrative finFET device along a fin structure, according to one example of principles described herein.

FIG. 3 is a diagram showing an illustrative finFET device along a fin structure. As can be seen, the gate device 134 includes a sidewall spacer that has an upper portion 124 and a lower portion 126. Both the upper sidewall spacer 124 and the lower sidewall spacer isolate the gate device from the source/drain regions 128.

Figure 4:
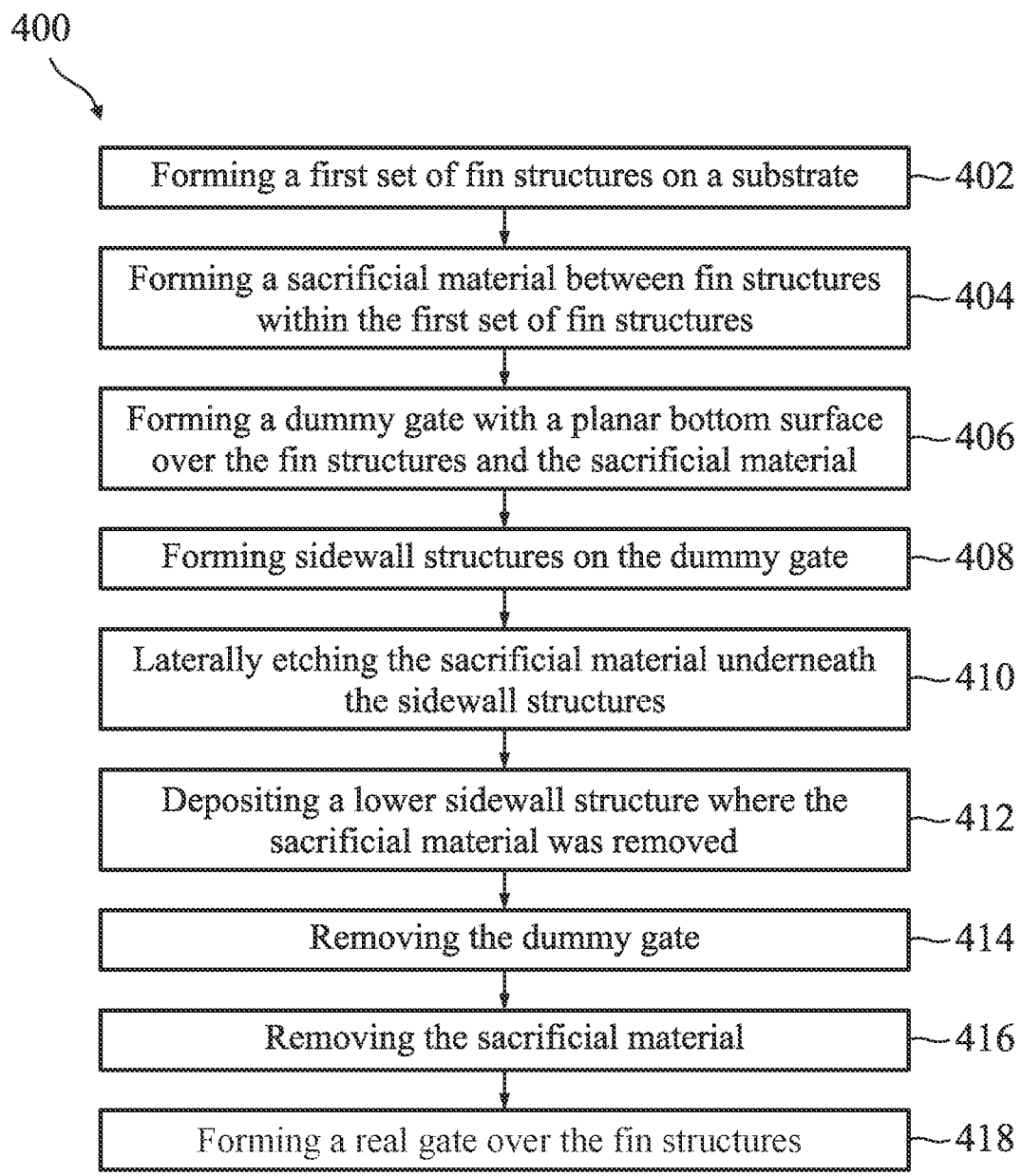
FIG. 4 is a flowchart showing an illustrative method for forming a finFET structure with improved pitch scaling, according to one example of principles described herein.

FIG. 4 is a flowchart showing an illustrative method 400 for forming a finFET structure with improved pitch scaling. According to the present example, the method 400 includes a process 402 for forming a first set of fin structures (e.g., 104) on a substrate (e.g., 102). The semiconductor substrate may be part of a silicon wafer. Other semiconductor materials are contemplated. The substrate may include an elementary (single element) semiconductor, such as silicon, germanium, and/or other suitable materials; a compound semiconductor, such as silicon carbide, gallium arsenide, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The fin structures may be formed using a patterning process. For example, a hard mask layer and a photoresist layer may be deposited onto the substrate. The photoresist may then be exposed to a light source through a photomask. The photoresist may then be developed such that the portions of the photoresist remain while other portions are removed. The pattern within the developed photomask is then transferred to the hard mask layer, which is then transferred to the substrate through an etching process. The fin structures comprise elongated fin-like structures that run parallel to each other.

The method 400 further includes a process 404 for forming a sacrificial material (e.g., 110) between fin structures within the first set of fin structures. The sacrificial material may be, for example, silicon nitride (SiN) or silicon germanium (SiGe). Such materials are easier to fit within the spaces between fin structures. In some examples, the sacrificial material is selectively deposited over the fin structures so as to leave the areas where there are no fin structures exposed. In some examples, however, the sacrificial material may be formed over those areas as well and then removed using a directional etching process such as a dry etching process. Such processes may be similar to spacer etching processes.

The method 400 further includes a process 406 for forming a dummy gate (e.g., 118) with a planar bottom surface over the fin structures and the sacrificial material. The dummy gate layer may be formed along with two hard mask layers (e.g., 120, 122). The first hard mask layer may be a silicon nitride layer and the second hard mask layer may be an oxide layer. The dummy gate layer is formed along a planar surface. In other words, the bottom surface of the dummy gate layer directly contacts a planar line that includes top surfaces of the fin structures and the sacrificial material. The dummy gate layer may be a polysilicon layer. Because the polysilicon dummy gate layer is deposited onto a planar surface, there are fewer issues (such as gaps in the polysilicon) resulting from fitting the polysilicon within the space between fin structures.

The method 400 further includes a process 408 for forming sidewall structures (e.g., 124) on the dummy gate. The sidewall structures may be a dielectric material. After the sidewall structures are formed, an etching process may be applied to remove portions of the fin structures where source/drain regions are to be formed. This etching process may be done in accordance with photolithographic processes so that the appropriate portions of the workpiece are etched.

The method 400 further includes a process 410 for laterally etching the sacrificial material underneath the sidewall structures. The lateral removal process removes a portion of the sacrificial material to leave a void underneath the sidewall spacer. The lateral etching process may be a unidirectional etching process such as a wet etching process. In some examples, the depth of the void may be greater than the thickness of the sidewall structures. In some examples, the depth of the void may be less than the thickness of the sidewall spacer. In some examples, the depth of the void may be within a range of about 4-10 nanometers. In some examples, the depth of the void may be within a range of about 5-15 nanometers.

The method 400 further includes a process 412 for depositing a lower sidewall structure (e.g., 126) where the sacrificial material was removed. The lower sidewall spacer will ultimately be disposed against the gate structure between the fin structures 104. Thus, the top surface of the lower sidewall spacer corresponds to and is thus on a same level as the top surface of the fin structures. The lower sidewall spacer may be a low-k dielectric layer such as silicon nitride (SiN), silicon carbonitride (SiCN), silicon oxycarbide (SiOC), silicon oxycarbonitride (SiOCN). In some examples, the lower sidewall spacer may be a different material than the sidewall spacer. The thickness of the lower sidewall spacer may be similar to the depth of the void. The thickness of the lower sidewall spacer may be within a range of about 4-10 nanometers. To form the lower sidewall spacer, the spacer material may be deposited onto the workpiece and then etched back. Specifically, a selective etching process may be designed such that it removes the lower sidewall spacer material directionally and does not substantially affect the other exposed portions of the workpiece. The portions of the lower sidewall structure underneath the sidewall spacer will thus be protected from the directional etching process.

The method 400 further includes a process 414 for removing the dummy gate. The sidewall structures remain in place while the dummy gate structure is removed. The dummy gate structure may be removed using an etching process. The etching process may be a unidirectional process such as a wet etching process that removes the dummy gate material without substantially affecting the other materials.

The method 400 further includes a process 416 for removing the sacrificial material. The sacrificial material may also be removed using a unidirectional etching process such as a wet etching process. The wet etching process may be selective so as to remove the sacrificial material while leaving the fin structures substantially intact. By removing the sacrificial material, the space between the fin structures is exposed and thus allows for deposition of the metal gate.

The method 400 further includes a process 418 for forming a real gate (e.g., 134) over the fin structures. Forming the real gate may include forming a high-k dielectric layer (e.g., 132). In some examples, an interfacial layer may be deposited on the fin structures before the high-k dielectric layer is deposited. The high-k dielectric layer may include, for example, aluminum oxide, hafnium oxide, zirconium oxide, hafnium aluminum oxide, or hafnium silicon oxide. Other materials may be used as well. The real gate may include a conductive material such as a metal material. The metal material is deposited to surround the sides of the fin structures and thus form a finFET device. In some examples, the real gate may include a workfunction layer (not shown). The workfunction layer may be a workfunction metal. Such metal is designed to metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (WSN), tungsten (W), cobalt (Co), molybdenum (Mo), etc. Various examples of n-type workfunction metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC). Using the techniques described herein, higher fin structures are achievable as well as reduced scaling.

According to one example, a semiconductor structure includes a first set of fin structures, a second set of fin structures, a dielectric stack positioned between the first set of fin structures and the second set of fin structures, the dielectric stack having a top surface at substantially a same level as top surfaces of the first and second sets of fin structures, the dielectric stack comprising: a first dielectric material conforming to a bottom and sides of the dielectric stack, a second dielectric material along a top surface of the dielectric stack, and a third dielectric material in a middle of the dielectric stack. The semiconductor structure further includes a gate structure positioned over the first set of fin structures, the second set of fin structures and the dielectric stack.

According to one example, a semiconductor structure includes a first set of fin structures, a second set of fin structures, a dielectric stack positioned between the first set of fin structures and the second set of fin structures, the dielectric stack having a top surface at substantially a same level as top surfaces of the first and second sets of fin structures, a gate structure positioned over the first set of fin structures, the second set of fin structures and the dielectric stack. The gate structure includes a first dielectric sidewall structure on sidewalls of a lower portion of the gate structure, and a second dielectric sidewall structure on sidewalls of an upper portion of the gate structure.

According to one example, a method includes forming a first set of fin structures on a substrate, forming a sacrificial material between fin structures within the first set of fin structures, forming a dummy gate with a planar bottom surface over the fin structures and the sacrificial material, forming sidewall structures on the dummy gate, laterally etching the sacrificial material underneath the sidewall structures, depositing a lower sidewall structure where the sacrificial material was removed, removing the dummy gate, removing the sacrificial material, and forming a real gate over the fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first set of fin structures on a substrate;
   forming a sacrificial material between fin structures within the first set of fin structures;
   forming a dummy gate with a planar bottom surface over the fin structures and the sacrificial material;
   forming sidewall structures on the dummy gate;
   laterally etching the sacrificial material underneath the sidewall structures;
   depositing a lower sidewall structure where the sacrificial material was removed.

2. The method of claim 1, after depositing the lower sidewall structure, further comprising:
   removing the dummy gate;
   removing the sacrificial material; and
   forming a real gate over the fin structures.

3. The method of claim 2, further comprising, forming source/drain features on the fin structures, the source/drain features being isolated from the real gate by the lower sidewall structure.

4. The method of claim 1, further comprising, forming a second set of fin structures on the substrate, the second set of fin structures being separated from the first set of fin structures by a distance greater than a pitch between the fin structures of the first set of fin structures.

5. The method of claim 4, further comprising, forming a dielectric stack between the first set of fin structures and the second set of fin structures, wherein forming the dielectric stack comprises:
   forming a first dielectric material on the substrate and along sidewalls of the fin structures;
   forming an oxide material on the first dielectric material;
   recessing the oxide material; and
   depositing a second dielectric material on the oxide material.

6. The method of claim 1, further comprising, after forming the sacrificial material, planarizing a top surface of the fin structures and the sacrificial material.

7. The method of claim 1, further comprising, after forming the sidewall structures, removing portions of the fin structures where source/drain regions are to be formed.

8. The method of claim 1, wherein the sidewall structures and the lower sidewall structure include different compositions.

9. The method of claim 1, wherein the lower sidewall structure comprises at least one of SiN, SiCN, SiOC, and SiOCN.

10. The method of claim 1, wherein a space between two adjacent fin structures of the first set of fin structures is between about 5 nm and about 10 nm.

11. A method comprising:
    forming a fin structure on a substrate;
    forming a sacrificial layer on sidewalls of the fin structure;
    planarizing a top surface of the fin structure and the sacrificial layer;
    forming a dummy gate over the fin structure and the sacrificial layer;
    forming sidewall structures on the dummy gate;
    replacing a portion of the sacrificial layer underneath the sidewall structures with a lower sidewall structure;
    removing the dummy gate;
    removing the sacrificial layer; and
    forming a real gate over the fin structure.

12. The method of claim 11, wherein replacing the portion of the sacrificial layer includes:
  laterally etching the portion of the sacrificial layer underneath the sidewall structures; and
  depositing the lower sidewall structure where the portion of the sacrificial layer was removed.

13. The method of claim 11, wherein the sidewall structures and the lower sidewall structure include different compositions.

14. The method of claim 11, further comprising, forming a dielectric stack adjacent to the fin structure, wherein forming the dielectric stack comprises:
  forming a first dielectric material on the substrate and along sidewalls of the sacrificial layer;
  forming an oxide material on the first dielectric material;
  recessing the oxide material; and
  depositing a second dielectric material on the oxide material.

15. The method of claim 11, further comprising, forming source/drain features on the fin structure, the source/drain features being isolated from the real gate by the lower sidewall structure.

16. The method of claim 11, further comprising, after forming the sidewall structures, removing a portion of the fin structure where source/drain regions are to be formed.

17. A method comprising:
  forming a first set of fin structures on a substrate;
  forming a second set of fin structures on the substrate, the second set of fin structures being separated from the first set of fin structures by a distance greater than a pitch between the fin structures of the first set of fin structures;
  forming a sacrificial material between the fin structures within the first set of fin structures and the second set of fin structures;
  forming a dummy gate with a planar bottom surface over the first set of fin structures, the second set of fin structures, and the sacrificial material;
  forming sidewall structures on the dummy gate;
  laterally etching the sacrificial material underneath the sidewall structures;
  depositing a lower sidewall structure where the sacrificial material was removed;
  removing the dummy gate;
  removing the sacrificial material; and
  forming a real gate over the first set of fin structures and the second set of fin structures.

18. The method of claim 17, further comprising, forming source/drain features on the first set of fin structures and the second set of fin structures, the source/drain features being isolated from the real gate by the lower sidewall structure.

19. The method of claim 17, after forming the sacrificial material, further comprising, forming a dielectric stack between the first set of fin structures and the second set of fin structures, wherein forming the dielectric stack comprises:
  forming a first dielectric material on the substrate and along sidewalls of the first set of fin structures;
  forming an oxide material on the first dielectric material;
  recessing the oxide material; and
  depositing a second dielectric material on the oxide material.

20. The method of claim 19, after forming the dielectric stack, further comprising, planarizing top surfaces of the first set of fin structures, the second set of fin structures, the sacrificial material, and the dielectric stack.

* * * * *